United States Patent [19]

Natsuhara

[11] Patent Number: 4,836,136
[45] Date of Patent: Jun. 6, 1989

[54] DEVELOPER SUPPLYING MEMBER
[75] Inventor: Toshiya Natsuhara, Osaka, Japan
[73] Assignee: Minolta Camera Kabushiki Kaisha, Osaka, Japan
[21] Appl. No.: 164,448
[22] Filed: Mar. 4, 1988

[30] Foreign Application Priority Data

| Mar. 5, 1987 | [JP] | Japan | 62-51791 |
| Mar. 5, 1987 | [JP] | Japan | 62-51792 |
| Mar. 5, 1987 | [JP] | Japan | 62-51793 |
| Mar. 5, 1987 | [JP] | Japan | 62-51794 |
| Mar. 5, 1987 | [JP] | Japan | 62-51795 |
| Mar. 5, 1987 | [JP] | Japan | 62-51796 |
| Mar. 5, 1987 | [JP] | Japan | 62-51797 |
| Mar. 5, 1987 | [JP] | Japan | 62-51798 |
| Mar. 5, 1987 | [JP] | Japan | 62-51799 |

[51] Int. Cl.$^4$ .......................................... G03G 15/09
[52] U.S. Cl. .................................. 118/657; 430/102; 355/251
[58] Field of Search ............... 118/657, 658, 656, 653; 430/102; 355/3 DD

[56] References Cited

U.S. PATENT DOCUMENTS

| 4,086,873 | 5/1978 | Morita et al. | 118/658 |
| 4,136,637 | 1/1979 | Snelling | 118/658 |
| 4,422,749 | 12/1983 | Hoshino et al. | 118/657 X |
| 4,522,907 | 6/1985 | Mitsuhashi et al. | 430/102 |
| 4,526,130 | 7/1985 | Fukuda et al. | 118/657 |
| 4,674,439 | 6/1987 | Sakamoto et al. | 118/657 |

FOREIGN PATENT DOCUMENTS 55-46768  4/1980  Japan .

Primary Examiner—R. L. Moses
Attorney, Agent, or Firm—Burns, Doane, Swecker & Mathis

[57] ABSTRACT

The disclosure relates to a developer supplying member such as a developing sleeve for use in the developing device of a copying apparatus. The developer supplying member of the invention is coated with an overcoat layer comprising an amorphous carbon film formed by plasma polymerization with a glow discharge method and containing fluorine.

Further, the overcoat layer comprises an organic polymerized film formed by causing glow discharge using at least one compound selected from the group consisting of fluorine incorporating methacrylate, fluorine incorporating acrylate and fluoroalkylsilane.

15 Claims, 6 Drawing Sheets

DEVELOPER SUPPLYING MEMBER

BACKGROUND OF THE INVENTION

1. Field of the Invention

The present invention relates to a developer supplying member, and more particularly to a developer supplying member such as a developing sleeve for use in the developing device of a copying apparatus.

2. Description of the Prior Art

In general, electrophotographic copying methods employ developing processes of which the Carlson process is representative. Electrostatic latent images are formed by charging a photoconductive photosensitive member and exposing it to light. Thereafter, a bicomponent developer comprising a toner and a carrier, or a monocomponent developer comprising toner alone, is retained on the surface of a rotatable developer supplying member and comes into contact with the aforesaid electrostatic latent image, thereby developing said latent image as a toner image. One of the well-known disadvantages inherent to these conventional developing methods is the problem of image fog. Fog appears due to electrostatic toner adhesion induced by a residual charge which is incurred during the developing process when the previous charge is not completely removed from the exposed porion of the photosensitive member. Developing then results in a generally soiled copy image. The application of a developing bias voltage is commonly used to eliminate this disadvantage.

The developing bias voltage method involves the application, with each development cycle, of a d.c. voltage or a d.c. voltage superposed on an a.c. voltage to an electrode provided on the developer supplying member, said voltage being of the same polarity as the residual potential of the exposed portion of the photosensitive member. At the same time, either hhe photosensitive member which acts as the opposed electrode or an electrically conductive substrate which is the single component most essential to the structure of the photosensitive member is grounded, thereby forming an electric field therebetween. The repulsion between the charge polarity of the exposed portion of the photosensitive member and the polarity of the applied bias voltage is used to prevent adhesion of the toner to the aforesaid exposed portions. Although the above described method relates to regular developing processes wherein the developing action occurs via an electrostatic image formed on the photosensitive member and an oppositely charged toner, a bias voltage may also be applied by the same method in cases of reverse developing which use a latent image and similarly charged toner, despite differences in polarity or potential. This developing bias application method effectively prevents the appearance of copy image fog, but conversely gives rise to new problems.

For example, when an electrical leak occurs between the electrode on the developer supplying member side and the electrode on the photosensitive member side, fog may occur due to a reduction in the developing bias potential. Many factors can cause this type of electrical leak, for example, in bicomponent developing, magnetic particles normally used as developer carriers may penetrate the layers of the photosensitive member and reach the electrically conductive substrate. Layer penetration of this type may occur when the photosensitive member has a low hardness, and is a particular problem for organic photosensitive members due to their low hardness, although they have seen remarkable recent developments. Furthermore, since pinhole-like defects are sometimes present in the photosensitive layer of photosensitive members, this problem may occur in bicomponent developing when the magnetic particles normally used as carriers and the electrically conductive substrate of the photosensitive member make contact, or in monocomponent developing, when the electrode on the developer supplying member and the electrically conductive substrate of the photosensitive member make contact. The reduction of so-called bias potential based on this type of developing in actual copying machines leads to long narrow bands of fog on the copy image and a marked reduction in copy image quality despite some developing in the defective section which is induced by the leak itself because not only the portion where the leak occurs but rather the entire portion where the developer and photosensitive member make contact is affected.

On the other hand, in monocomponent developing, the toner must be charged prior to developing with a specified polarity in accordance with the polarity of the electrostatic latent image and the type cf developing, either standard or reverse. For example, methods using gapped triboelectrically charging blades, methods of toner charging via a corona charger, and methods of imparting a charge to the toner by having the toner make contact with a metal plate which has a bias voltage applied thereto are all considered in toner and triboelectrically charging order. However, the triboelectrically charging blade method is either unsuitable for high speed developing because of inadequate toner charging, cr a plurality of triboelectrically charging blades must be provided so as to adequately charge the toner. The methods employing a corona charger cause dispersal of the toner due to the action of the electric field generated during corona charging, and do not adequately charge to the interior of the toner layer. Furthermore, methods whereby a charge is imparted by a metal plate do not present the aforesaid disadvantages to any great degree. When a difference in potential is formed between the developer supplying member and the metal plate by the conductivity of said member so as to charge the toner as it passes therebetween, the electrode of the developer supplying member is overly effective during developing, thereby causing an inadequate edge effect. In developing which uses a single compcnent toner, an extremely large electrode effect arises in the vicinity just below the toner layer where the electrostatic latent image and the surface of the developer supplying member are in proximity because the thickness of the toner layer on the developer supplying member is at most 50 $\mu$m. Accordingly, gradients are poor, as is the reproducibility of low density original documents.

In order to eliminate these disadvantages, a high resistance layer or a layer with a high degree of hardness is provided as a covering on the developer supplying member. That is, the photcsensitive member and develooer supplying member have a low-resistance layer disposed therebetween so as to prevent the aforesaid reduction of bias pctential, inadequate charging or excessive electrode effect.

For example, U.S. Pat. No. 4,086,873 discloses a developing method for electrophotographic copying processes wherein the surface of an endless member is provided with a high-resistance layer via an aluminum anodizing process, or a silicon resin, urea resin, melamine resin, polyvinyl butyral resin and the like as a surface protective layer. Further, Unexamined Japanese Patent Publication Sho No. 55-46768 discloses an electrostatic latent image developing apparatus with a developer supplying member provided with a surface layer of silicon rubber, neoprene rubber, nitrile rubber and the like, of about 5 mm in thickness and which provides a volumetric specific resistivity of $10^8$ ohm-cm to $10^{15}$ ohm-cm.

Technology for providing surface covering layers for developer supplying members in order to eliminate the aforesaid deterioration of copy image quality induced by reduction of bias potential, inadequate charging or excessive electrode effect, require that said cover layer be of suitably high resistance. Further, the cover layer must employ a material with low fusability vis-a-vis the developer and a high degree of hardness so as to avoid damage contact with other members or frequent developer soiling during actual use in a copying machine. The cover layer must be without resistance irregularities over the entire region of said layer, and must have a homogeneous, uniform thickness to maintain a so-called developer gap of specific measurement between said cover layer and the photosensitive member. A developer supplying member having with such a cover layer must also provide adequate developer transportability. However, conventional examples cannot necessarily be said to adequately meet these performance requirements, therefore cover layer materials of higher performance characteristics are needed.

SUMMARY OF THE INVENTION

A main object of the present invention is to provide a developer supplying member which prevents copy image fog induced by a developing bias potential reduction, and which can provide superior copy images.

Another object of the invention is to provide a developer supplying member which can prevent inadequate developer charging and excessive electrode effect between the photosensitive member and the developer supplying member.

Still another object of the invention is to provide a developer supplying member which does not reduce copy image quality and has excellent resistance.

A further object of the invention is to provide a developer supplying member having a surface cover layer of high resistance, superior hardness, and low fusability vis-a-vis the developer.

An even further object of the invention is to provide a developer supplying member which has superior developer transportability.

These and other objects of the present invention are accomplished by providing a developer supplying member provided with a surface cover layer comprising an amorphous carbon film incorporating fluorine.

DETAILED DESCRIPTION OF THE PREFERRED EMBODIMENT

Figure 1:
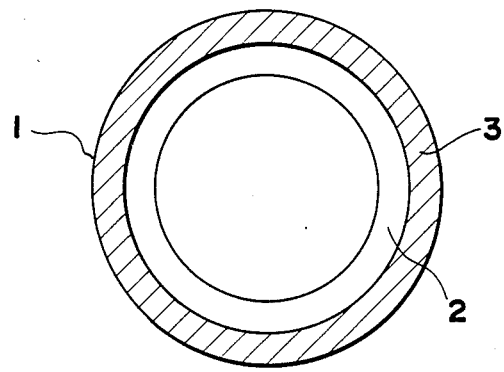
FIG. 1 show the structure of a developer supplying member of the presen invention.

The present invention employs hydrocarbon compounds in manufacturing an amorphous carbon film containing fluorine.

These hydrocarbons need not always be in a gaseous phase at room temperature and atmospheric pressure but can be in a liquid or solid phase insofar as they can be vaporized on melting, evaporation or sublimation, for example, by heating or in a vacuum. Examples of useful hydrocarbons are.saturated hydrocarbons, unsaturated hydrocarbons, alicyclic hydrocarbons, aromatic hydrocarbons and the like. Such hydrocarbons are usable in combination.

A wide variety of hydrocarbons are usable. Examples of useful s turated hydrocarbons are normal paraffins, such as methane, ethane, propane, butane, pentane, hexane, heptane, octane, nonane, decane, undecane, dodecane, tridecane, tetradecane, pentdecane, hexadecane, heptadecane, octadecane, nonadecane, eicosane, heneicosane, heptacosane, octacosane, tricosane, tetracosane, pentacosane, hexacosane, heptacosane, octacosane, nonacosane, triacontane, dotriacontane, pentatriacontane, etc.; isoparaffins such as isobutane, isopentane, neopentane, isohexane, neohexane, 2,3-dimethylbutane, 2-methylhexane, 3-ethylpentane, 2,2-dimethylpentane, 2,4-dimethylpentane, 3,3-dimethylpentane, tributane, 2-methylheptane, 3-methylheptane, 2,2-dimethylhexane, 2,2,5-dimethylhexane, 2,2,3-trimethylpentane, 2,2,4-trimethylpentane, 2,3,3-trimethylpentane, 2,3,4-trimethylpentane, isononane and the like.

Examples of useful unsaturated hydrocarbons are olefins, such as ethylene, propylene, isobutylene, 1-butene, 2-butene, 1-pentene, 2-pentene, 2-methyl-1-butene, 3-methyl-1-butene, 2- methyl-2-butene, 1-hexene, tetramethylethylene, 1-heptene, 1-octene, 1-nonene, 1-decene and the like; diolifins such as allene, methylallene, butadiene, pentadiene, hexadiene, cyclopentadiene, and the like; triolifins. such as ocimene, alloocimene, myrcene, hexatriene, and the like; and acetylene, methylacetylene, 1-butyne, 2-butyne, 1-pentyne, 1-hexyne, 1-heptyne, 1-octyne, 1-nonyne, 1-decyne, and the like.

Examples of useful alicyclic hydrocarbons are cycloparaffins such as cyclopropane, cyclobutane, cyclopentane, cyclohexane, cycloheptane, cyclooctane, cyclononane, cyclodecane, cycloundecane, cyclododecane, cyclotridecane, cyclotetradecane, cyclopentadecane, cyclohexadecane, and the like; cycloolifins such as cyclopropene, cyclobutene, cyclopentene, cyclohexene, cycloheptene, cyclooctene, cyclononene, cyclodecene and the like; terpenes such as limonene, terpinolene, phellandrene, sylvestrene, thujene, carene, pinene, bornylene, camphene, fenchene, cyclofenchene, tricyclene, bisabolene, zingiberene, curcumene, humulene, cadinene sesquibenihene, selinene, caryophyllene, santalene, cedrene, camphorene, phyllocladene, podocarpene, mirene and the like; steriods, etc.

Examples of useful aromatic hydrocarbons are benzene, toluene, xylene, hemimellitene, pseudocumene, mesitylene, prehnitene, isodurene, durene, pentamethylbenzene, hexamethylbenzene, ethybbenzene, propyl-benzene, cumene, styrene, biphenyl, terphenyl, diphenylmethane, triphenylmethane, dibenzyl, stilbene, indene, naphthalene, tetralin, anthracene, phenanthrene, and the like.

Fluorine compounds may be used in addition to the hydrocarbon compounds for the express purpose of adding fluorine atoms to the amorphous carbon film incorporating fluorine of the invention.

These fluorine compunds need not always be in a gaseous phase at room temperature and atmospheric pressure but can be in a liquid or solid phase insofar as they can be vaporized on melting, evaporation or sublimation, for example, by heating or in a vacuum. Useful fluorine compounds are, for example, inorganic compounds such as fluorine, hydrogen fluoride, chlorine fluoride, bromine fluoride, iodine fluoride, sulphur fluoride, oxygen fluoride, arsenic fluoride, boron fluoride, ammonium hydrogen fluoride, potassium hydrogen fluoride, sulfuryl fluoride, selenium fluoride, thionyl fluoride, thiophosphoryl fluoride, nitrogen fluoride, tellurium fluoride, niobium fluoride, nitryl fluoride, nitrosyl fluoride, cyanogen fluoride, phosphoryl fluoride, or organic compounds such as methyl fluoride, ethyl fluoride, propyl fluoride, butyl fluoride, amyl fluoride, hexyl fluoride, heptyl fluoride, octyl fluoride, nonyl fluoride, decyl fluoride, ethylene fluoride, butylene fluoride, butadiene fluoride, acetyl fluoride, vinylidene fluoride, fluorobenzene, fluorostyrene, fluoroform, oxalyl fluoride, carbonyl fluoride, ethylidene fluoride, allyl fluoride, chromyl fluoride, cyanogen fluoride, methacrylates containing fluoride, acrylates containing fluoride, fluoroalkylsilane and the like.

These hydrocarbon compounds and fluorine-containing compounds need not always be in a gaseous phase at room temperature and atmospheric pressure but can be in a liquid or solid phase insofar as they can be vaporized on melting, evaporation or sublimation, for example, by heating or in a vacuum. Accordingly, a normal plasma CVD method can be employed in a glow discharge decomposition process in a vacuum to produce the fluorine-containing amorphous carbon film of the present invention. That is, the fluorine-containing amorphous carbon film of the present invention is produced by a so-called plasma CVD reaction wherein compounds are selected from among the aforesaid compounds so that the material gas will comprise at least carbon and fluorine atoms, the material gas is subjected to discharge decomposition in a vacuum, and the active neutral constituents or charged constituents contained in the resulting plasma atmosphere are led onto a substrate by diffusion or an electric or magnetic force and accumulated into a solid phase on the substrate through a recombination reaction.

The fluorine-containing amorphous carbon film of the present invention may also be a plasma-polymerized film formed by subjecting a compound gas containing at least methacrylate containing fluorine or acrylate containing fluorine or fluoroalkylsilane to a plasma-polymerization reaction following glow discharge decomposition in a vacuum.

Examples of useful methacrylates with fluorine and acrylates with fluorine atoms are, for example, 2,2,2-trifluoroethylmethacrylate [$CH_2$=$C(CH_3)COOCH_2CF_3$], 2,2,3,3,-tetrafluoropropylmethacrylate [$CH_2$=$C(CH_3)COOCH_2(CF_2)_2H$], 1H,1H,5H-octafluoropentyl-methacrylate [$CH_2$=$C(CH_3)COOCH_2(CF_2)_4H$], 1H,1H,2H,2H-heptadecafluorodecyl-methacrylate [$CH_2$=$C(CH_3)COO(CH_2)_2(CF_2)_8F$], 2,2,2-trifluoroethyl-acrylate [$CH_2$=$CHCOOCH_2CF_3$], 2,2,3,3-tetrafluoropropylacrylate [$CH_2$=$CHCOOCH_2(CF_2)_2H$], 1H,1H,5H-octafluoropentylacrylate [$CH_2$=$CHCOOCH_2(CF_2)_4H$, 1H,1H,2H,2H-heptadecafluorodecylacrylate [$CH_2$=$CHCOO(CH_2)_2(CF_2)_8F$] and the like.

Examples of useful fluoroalkylsilanes are $CF_3CH_2CH_2Si(OCH_3)_3$, $CF_3CH_2CH_2SiCl_3$, $CF_3(CF_2)_5CH_2CH_2SiCl_3$, $CF_3(CF_2)_5CH_2CH_2Si(OCH_3)_3$, $CF_3(CF_2)_7CH_2CH_2SiCl_3$, $CF_3(CF_2)_7CH_2CH_2Si(OCH_3)_3$, $CF_3(CF_2)_7CH_2CH_2SiCH_3Cl_2$, $CF_3(CF_2)_7CH_2CH_2Si(CH_3)(OCH_3)_3$.

These organic compounds may be in either liquid or solid phase at room temperature and atmospheric pressure, but are readily melted and vaporized via heating or pressure reduction. Accordingly, the plasma polymerization reaction of the present invention may be readily accomplished via a conventional plasma chemical vapor deposition (CVD) process. The following is an example of a plasma CVD reaction which produces a polymer. When at least a methacrylate containing fluorine and/or an acrylate containing fluorine and/or fluoroalkylsilane are in vapor phase and subjected to a glow-discharge decomposition process at reduced pressure, the activated neutral constituents or charged constituents in the generated plasma atmosphere are diffused on the substrate and subjected to induction by electric or magnetic force, thereby inducing a recombination reaction of said constituents which are then deposited on the substrate as a solid.

All of the aforesaid material gases may be mixed with carrier gases such as, for example, hydrogen, herium, argon, or xenon and the like, in the plasma CVD reaction so as to maintain discharge stability, stable film formability and stable material gas supply.

The material gases can be mixed with, for example, gases containing atoms from elements in Group III of the Periodic Table of the Elements, gases containing atoms from elements in Group V, atoms of alkaline metals or halogen atoms to regulate the electrical properties of the fluorine-containing amorphous carbon film thus produced.

The cover layer of the present invention may have a thickness 500 $\mu$m. When the film thickness is less than 1 $\mu$m the required resistance values cannot necessarily be assured, and wear resistance is also undesirably reduced. A film thickness exceeding 2 mm is undesirable from a production standpoint. A deposition speed of 0.01 to 50 $\mu$m/min is preferred for this fluorine-containing amorphous carbon film. A deposition speed lower than 0.01 $\mu$m/min is undesirable from a production standpoint, whereas a deposition speed exceeding 50 $\mu$m/min reduces film formability, creates a rough film, and reduces film coverability vis-a-vis the substrate surface. The thickness of the cover layer is readily controllable by regulating the film formation time. Although the amount of.control may vary depending on the model of the plasma CVD apparatus used, the deposition speed of the fluorine-containing amorphous carbon film can be increased, for example, by increasing the flow rate of the material gases, increasing the applied voltage, reducing the frequency of the applied voltage, reducing the substrate temperature or any combination of these methods.

The quantity of fluorine atoms incorporated in the fluorine-containing amorphous carbon film of the present invention is 0.1 to 35 atomic %, more preferably 2 to 30 atomic %, and ideally 10 to 25 atomic %. When the quantity of fluorine atoms is less than 0.1 atomic %, the member may become soiled by developer or be easily damaged through contact with other components, which is undesirable from the standpoint of durability, whereas a fluorine content exceeding 35 atomic % is undesirable due to reduced charging.

Furthermore, the configuration of the developer supplying member of the present invention is not specifically limited in either its method of manufacture or implementation. For example, said member may be cylindrical or belt-shaped. In order to improve developer transportability of the fluorine-containing amorphous carbon film of the present invention, it may be formed so as to have a surface relief pattern of either lines or points. The linear or punctate surface relief pattern provided on the fluorine-containing amorphous carbon film of the invention can be formed by a latent image formation process whereby linear or punctate latent images are formed by exposing said film to an electron beam, or a developing process whereby a latent image is subjected to plasma etching.

Thelinear and punctate latent image configurations are not specifically limited insofar as they fulfill the aforesaid requirements for developer transportability. The linear configuration may entail, for example, straight, lattice, single spiral, multi-spiral or like shapes, whereas the punctate configuration may comprise, for example, points of circular, oval, rectangular or like shapes.

The fluorine-containing amorphous carbon film of the present invention has so-called negative etching characteristics wherein concavities are formed via plasma etching of that portion of the film which has been previously exposed to an electron beam drawing, but these etching characteristics may be altered to positive characteristics by thereafter exposing said layer to carbon tetrafluoride plasma. The carbon tetrafluoride plasma exposure processing time must be adjusted in accordance with the plasma conditions and the thickness of the fluorine-containing amorphous carbon film, but a period of about 1 to about 30 min is generally suitable. Further, exposure to carbon tetrafluoride may be conducted using the plasma CVD apparatus used to produce the fluorine-containing amorphous carbon film without further alteration of said apparatus.

The effect of this negative-to-positive reversal induced on the fluorine-containing amorphous carbon film by exposure to carbon tetrafluoride plasma is believed to cause the introduction into the flu rine-containing amorphous carbon film of carbon or fluorine atoms fom the carbon tetrafluoride plasma or cause the adhesion of atoms from the stainless steel components in the vacuum device upon the surface of the fluorine-containing amorphous carbon film due to sputtering induced by the carbon tetrafluoride plasma.

The methods for forming linear or punctate relief patterns on the fluorine-containing amorphous carbon film of the invention include electron beam drawing in the latent image formation process using, for example, vector scanning or raster scanning or like method. The electron beam may be a point-shaped electron beam, fixed shape beam or variable shape electron beam. The developing process of the invention may employ dry etching by plasma.

As stated above, in the present invention, random linear or punctate latent image relief patterns can be formed upon the fluorine-containing amorphous carbon film without using a wet etching process.

The depth of the linear and punctate surface relief patterns thus produced may differ depending on the type of developing device used for the developer supplying member of the invention, but the thickness of the concave portion of the amorphous carbon layer is in general 0 to 95% vis-a-vis the thickness of the convex portion. A 0% concavity-to-convexity relationship forms a single mode of the invention wherein the fluorine-containing amorphous carbon film will have been completely removed. The maximum diameter of linear o punctate surface relief patterns may differ according to the type of developing device used for the developer supplying member of the present invention, but a diameter in the range of about 5 $\mu$m to 2 mm is preferred.

An explanation of the present invention follows hereinafter with reference to the drawings. Although the developer supplying member of the present invention is described in the present examples as having a cylindrical shape, the developer supplying member of the invention can similarly be obtained with different shapes.

FIG. 1 shows a sectional view of the developer supplying member of the present invention. Items labeled in the drawing are the developer supplying member 1, bias application electrode 2, and fluorine containing amorphous carbon film 3 which forms the cover layer.

Figure 2:
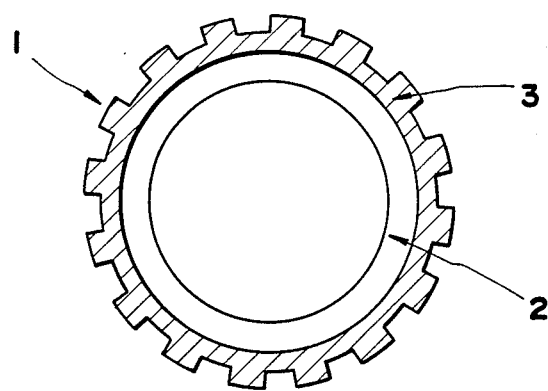
FIG. 2 show the structure of a developer supplying member of the invention provided with a surface relief.
Figure 3A:
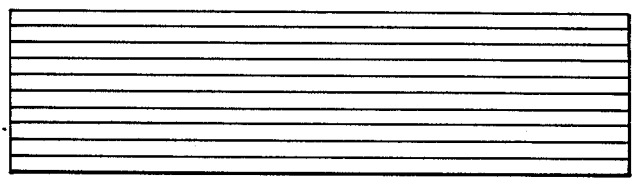
FIGS. 3a and 3b and FIGS. 4a and 4b show views of the member shown in FIG. 2.
Figure 3B:
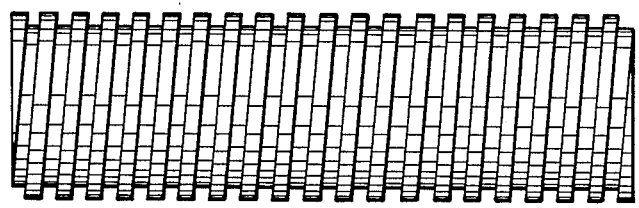
Figure 4A:
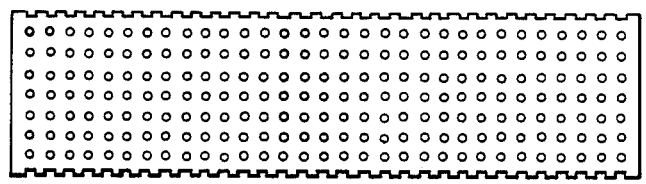
Figure 4B:
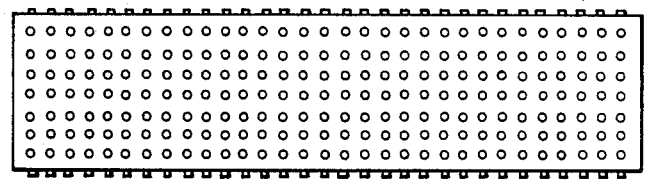

FIG. 2 is a sectional view showing the cover layer of the invention provided with linear or punctate surface relief patterns thereon.

FIGS. 3a and 3b and 4a and 4b are lateral views of the developer supplying member of the invention showing examples of various cover layers provided with linear and punctate surface relief patterns.

Figure 5:
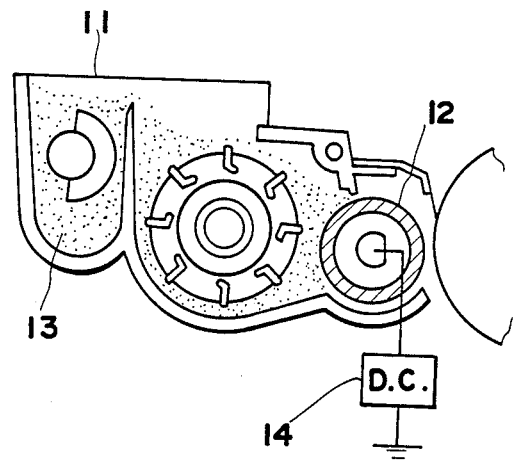
FIGS. 5 and 6 show single examples of developing apparatus provided with developer supplying members of the present invention.

FIG. 5 shows a single embodiment of a bicomponent developing apparatus employing the developer supplying member of the invention. Items labeled in the drawing are the developing apparatus 1, developer supplying member 12, developer 13 and bias application electrode 14.

The toner in the developer 13 is triboelectrically charged by mixing with a carrier and is transported to the developer supplying member 12 via the magnetic force provided by a magnet installed within said member, the toner is then transported to the developing region on the surface of the photosensitive member opposite said developer supplying member 12 by means of the rotation of said developer supplying member 12.

Figure 6:
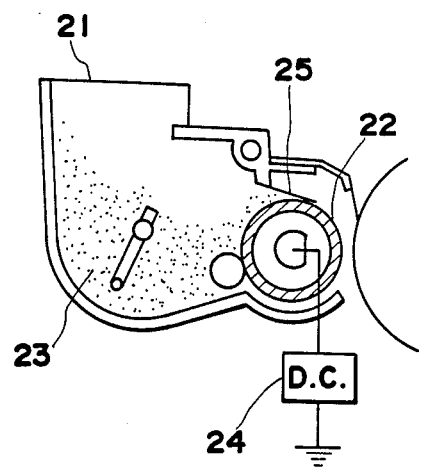

FIG. 6 shows a single embodiment of a monocomponent developing apparatus employing the developer supplying member of the invention. Items labeled in the drawing are the developing apparatus 21, developer supplying member 22, developer 23, bias application electrode 24 and regulating member 25.

Developer 23 is transported via .the rotation of the developer supplying member 22, and is triboelectrically charged as it passes through the gap provided between the regulating member 25 and the developer supplying member 22 via the pressure contact imparted by said regulating member 25. At the same time, a thin toner layer is formed on the developer supplying member 22 which is then transported to the developing region on the surface of the photosensitive member disposed opposite.

Figure 7:
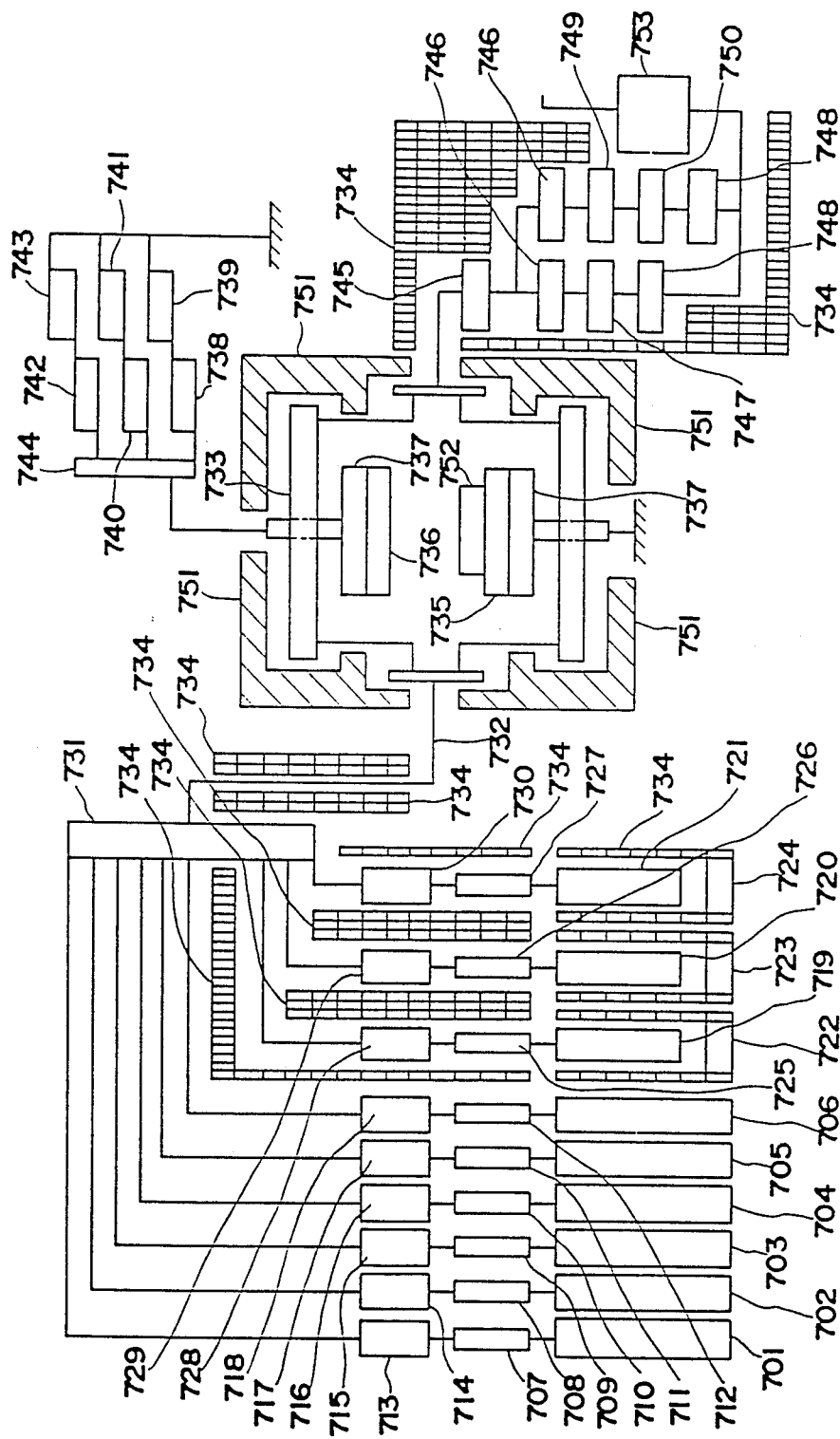
FIG. 7 shows a CVD apparatus for preparing the organic polymer film of the present invention.

FIG. 7 shows the plasma CVD apparatus used to form the fluorine-containing amorphous carbon film of the present invention. This apparatus can also be used for the dry etching process.

The first to sixth tanks 701 to 706 have enclosed therein starting material compounds, bombardment gas, etching gas and carrier gas which are in gas phase at room temperature, and are connected respectively to the first to sixth regulator valves 707 to 712 and first to sixth flow controllers 713 to 718. First to third containers 719 to 721 contain starting material compounds which are liquid or solid at room temperature, which can be preheated by first to third heaters 722 to 724 for vaporizing the compounds, and are connected to the seventh to ninth regulator valves 725 to 727 and the seventh to ninth flow controllers 728 to 730, respectively. The gases to be used as selected from among these gases are mixed in a mixer 731 and fed to a reactor 733 via a main pipe 732. The interconnecting piping can be heated by a pipe heater 734 which is suitably disposed so that the material compound, in a liquid or solid phase at room temperature and vaporized by preheating, will not condense during transport. A grounded electrode 735 and a power electrode 736 are so arranged that they oppose each other within the reactor 733. Each of these electrodes can be heated by an electrode heater 737. The power application electrode 736 is connected to a high-frequency power source 739 via a high-frequency power matching device 738, to a low-frequency power source 741 via a low-frequency power matching device 740, and to a direct current power source 743 via a low-pass filter 742. Power of one of the different frequencies is applicable to the electrode 736 by way of a connection selecting switch 744. The internal pressure of the reactor 733 is is adjustable by a pressure control valve 745. The reactor 733 is evacuated by a diffusion pump 747 and an oil rotary pump 748 via an exhaust system selecting valve 746, or by a cooling-removing device 749, a mechanical booster pump 750 and an oil rotary pump 748 via the exhaust system selecting valve 746. The exhaust gas is further made harmless by a suitable removal device 753 and then released to the atmosphere. The evacuation piping system can also be heated by a suitably disposed pipe heater 734 so that the material compound which is liquid or solid at room temperature and vaporized by preheating will not condense during transport.

For the same reason, the reactor 733 can also be heated by a reactor heater 751. An electrically conductive hollow cylindrical member is used as substrate 752 and has an electrode heater 737 provided therein. A similarly hollow cylindrically-shaped power application electrode 736 is disposed around the substrate 752, said electrode 736 having another electrode heater 737 provided externally. Substrate 752 is rotatable via a drive motor 754 mounted outside.

A suitable substrate transporting device and gate valve may by employed on the apparatus for preparing the cover layer of the developer supplying member of the present invention so as to allow the plasma CVD process to be conducted in succession without breaking the vacuum in the reactor. This arrangement would also prevent contamination of the substrate and apparatus when the substrate is removed from the reactor, and is desirable so as to stabilize conditions under which the developer supplying member of the present invention is manufactured.

The aforesaid plasma CVD apparatus can also be connected to a preparation facility or the like via a gate valve for access to the electron beam exposure device used for latent image formation and dressing and desorption of the substrate. Further, this arrangement allows the formation of linear or punctate surface relief patterns on the substrate completely without the need for vitiating the vacuum.

In the plasma CVD apparatus used to produce the fluorine-containing amorphous carbon film of the present invention and shown in FIG. 7, the reactor is first evacuated by the diffusion pump to a vacuum of about $10^{-4}$ to about $10^{-6}$ torr, whereby the adsorbed gas within the reactor is removed. The reactor is also checked for the degree of vacuum. At the same time, the electrodes and the substrate are heated to a predetermined temperature by the electrode heater. Subsequently, suitably selected material gases from the first to sixth tanks and first to third containers are fed into the reactor at a specified flow rate using the first to ninth flow controllers, and the interior of the reactor is maintained in a predetermined vacuum by the pressure control valve. After the combined flow of gases has become stabilized, the low-frequency power source, for example, is selected by the connection selecting switch to apply a low-frequency power to the power application electrode. This initiates a discharge across the two electrodes, forming a solid film on the substrate with time. The thickness of the film is controllable by varying the reaction time, such that the discharge is discontinued upon the thickness reaching the desired value. Consequently, a developer supplying member of the invention is obtained. Thereafter, the first to ninth control valves are closed and the reactor is thoroughly exhausted.

The thus obtained film may be provided with linear or punctate surface relief patterns in the manner described hereinafter. That is, the obtained film may be subjected to the following electron beam drawing process to produce a film having negative etching characteristics. When positive etching characteristics are required in the electron beam drawing process, the member can be subjected to a second film formation process similar to the first operation, wherein carbon tetrafluoride gas from one of the first to sixth tanks is introduced to the reactor and discharged. One of the characteristics of the film of the present invention is that either negative or positive etching characteristics can be selectably obtained by a few operations.

Subsequently, the substrate with the film of the present invention formed thereon is transported to the electron beam exposure apparatus and the desired linear or punctate relief patterns are drawing by a conventional method, thereby forming a latent image.

Next, the substrate with the latent image formed thereon is transported once again to the plasma CVD apparatus of the invention, whereupon said latent image is developed by an operation similar to that of the film formation process, i.e., etching gas from one of the first to sixth tanks is introduced into the reactor and discharged.

Thus, a developer supplying member of the present invention covered by a film provided with linear and punctate relief patterns can be obtained by the aforesaid sequence of the developer supplying member formation process, completely without the use of a wet process.

The present invention is described in the following examples.

EXAMPLE 1

The developer supplying member shown in FIG. 1 was produced using the plasma CVD apparatus used for the fluorine-containing amorphous carbon film formation.

The plasma CVD apparatus shown in FIG. 7 was used. First the interior of the reactor 733 was evacuated to a high vacuum of approximately $10^{-6}$ torr, and the seventh regulator valve 725 was thereafter opened to introduce styrene gas from the first container 719 and heated to a temperature of 65° C. by first the heater 722 into the seventh flow controller 728. At the same time, the first and second regulator valves 707 and 708 were opened to introduced hydrogen gas from the first tank 701 and carbon tetrafluoride gas from the second tank 702 into the first and second flow controllers 713 and 714 respectively. The dials on the flow controllers were adjusted to supply the styrene gas at a flow rate of 16.8 sccm, the hydrogen gas at 100 sccm, and the carbon tetrafluoride gas at 50 sccm, to the reactor 733 through the main pipe 732 via the intermediate mixer 731. Following stabilization of each gas flow, the internal pressure of the reactor 733 was adjusted to 0.2 torr by the pressure control valve 745. On the other hand, hhe substrate 752 was used, said substrate being an aluminum cylindrical substrate measuring 22 mm in diameter and 330 mm in length. The temperature of substrate 752 was preheated to 70° C. prior to the introduction of the gases. With the gas flow rates and the pressure in stabilized states, 145-watt power with a frequency of 50 kHz was applied to the power application electrode 736 from the low-frequency power source 741 pre-connected thereto by the selecting switch 744 to conduct plasma polymerization for approximately 30 min, forming a plasma-polymerized film 100 82 m in thickness on the substrate 752. After completion of the film formation, the power supply was discontinued, the regulator valves were closed, and the reactor 733 was thoroughly exhausted.

When the thus obtained fluorine-containing amorphous carbon film was subjected to elementary analysis, the quantity of hydrogen atoms found therein was 39 atomic % and the quantity of fluorine atoms totalled 10.3 atomic % based on the total constituent atoms of the structure. Further, the film possessed a hardness greater than 7H based on measurements for pencil lead hardness as provided in Japanese Industrial Standards JIS-K-5400, said hardness rating being greatly superior to that of polymer films obtained from conventional organic compound reactions.

In order to evaluate the characteristics of the developer supplying member obtained in Example 1, said developer supplying member was installed in the bicomponent developing apparatus shown in FIG. 5 and used in an EP470Z copying machine (Minolta Camera Co., Ltd.). Actual copies were evaluated in regard to the socalled bias potential drop in a normal Carlson process. An organic photosensitive member was intentionally provided with pin holes in the photosensitive layer so as to expose the substrate in that region, and a standard developing method was used.

First, the surface of the photosensitive member was charged to $-700$ V by a normal corona discharge,.then exposed to light to of the photosensitive member was developed as a $-150$ V bias potential was applied thereto via the developing apparatus with the developer supplying member obtained in Example 1 installed therein, and thereafter a toner image was transferred to copy paper and fused thereon. The photosensitive member was discharged and cleaned, and then the process was repeated 1,000 times.

Throughout the evaluation, the toner image was not formed on the copy paper pursuant to the aforesaid potential setting, nor did a band of fog appear due to the bias potential reduction. However, when an identical evaluation was made of a developer supplying member not provided with a plasma-polymerized film, a band of fog was produced. It is understood from the above results that the developer supplying member of Example 1 effectively prevents the so-called bias potential reduction.

Subsequently, the bias potential was changed to $-450$ V and reverse developing was repeated 1,000 times and then evaluated. Throughout the evaluation, a so-called solid image was formed on the copy paper pursuant to the aforesaid potential setting, and so-called whiteout bands corresponding to the fog in standard developing did not appear. However, when an identical evaluation was made of a developer supplying member not provided with a plasma-polymerized film, a whiteout band was produced. It is understood from the above results that the developer supplying member of Example 1 effectively prevents the so-called bias potential reduction.

The characteristics of the obtained developer supplying member were further evaluated by installing the member obtaineded Example 1 in a monocomponent developing apparatus as shown in FIG. 6, and conducting toner charging tests.

First, a specified toner was introduced into the aforesaid monocomponent developing apparatus, and the developer supplying member obtained in the example was rotated for 5 s at 100 rpm. When the charge possessed by the toner adhering to the developer supplying member was measured after the member stopped rotating, it was found to be 18 $\mu$C/g. However, when an identical evaluation was made of a developer supplying member not provided with a plasma-polymerized film, a charge of only 7 $\mu$C/g was measured. From the above results it is understood that the developer supplying member of Example 1 can suitably charge toner used in monocomponent developing.

In order to evaluate the characteristics of the developer member was installed in the bicomponent developing apparatus shown in FIG. 5 and used in an EP470Z copying machine (Minolta Camera Co., Ltd.). Durability tests were then performed normally. When the surface of the developer supplying member was inspected after making 30,000 A4-size copies, there was no indication of separation of the plasma-polymerized film, nor were toner adhesion or damage observed. However, when an identical evaluation was made of a developer supplying member not provided with a plasma-polymerized film, so-called toner film-like adhesion and reduced copy image density due to reduced toner transportability were observed. From the above results it is understood that the developer supplying member of Example 1 possesses excellent durability.

EXAMPLE 2

The developer supplying member shown in FIG. 1 was produced using the plasma CVD apparatus used for forming the fluorine-containing amorphous carbon film.

The plasma CVD apparatus shown in FIG. 7 was used. First the interior of the reactor 733 was evacuated to a high vacuum of approximately $10^{-6}$ torr, and the first, second and third regulator valves 707, 708 and 709 were thereafter opened to introduce hydrogen gas from the first tank 701, butadiene gas from the second tank 702, and carbon tetrafluoride gas from the third tank 703 into the first second and third flow controllers 713, 714 and 715 respectively. The dials on the flow controllers were adjusted to supply the hydrogen gas at a flow rate of 300 sccm, the butadiene gas at 60 sccm, and the carbon tetrafluoride gas at 120 sccm, to the reactor 733 through the main pipe 732 via the intermediate mixer 731. Following stabilization of each gas flow, the internal pressure of the reactor 733 was adjusted to 1.0 torr by the pressure control valve 745. On the other hand, the substrate 752 was used, said substrate being a cylindrical aluminum substrate measuring 22 mm in diameter and 330 mm in length. The substrate 752 was preheated to a temperature of 200° C. prior to the introduction of the gases. With the gas flow rates and the pressure n stabilized states, 160-watt power with a frequency of 200 kHz was applied to the power application electrode 736 from the low-frequency power source 741 preconnected thereto by the selecting switch 744 to conduct plasma polymerization for approximately 1 hr, thereby forming a plasma-polymerized film 500 μm in thickness on the substrate 752. After completion of the film formation, the power supply was discontinued, the regulator valves were closed, and the reactor was thoroughly exhausted.

When the thus obtained plasma-polymerized film was subjected to elementary analysis, the quantity of hydrogen atoms found therein was 42 atomic % and the quantity of fluorine atoms totalled 2.5 atomic % based on the total constituent atoms of the structure. Further, the film possessed a hardness greater than 7H based on measurements for pencil lead hardness as provided in Japanese Industrial Standards JIS-K-5400, said hardness rating being greatly superior to that of polymer films obtained from conventional organic compound reactions.

When the characteristics of the obtained developer supplying member were evaluated in the same manner as described in Example 1, a degree of reduced hardness was observed, but presented no problem from a practical standpoint. Other findings were virtually identical with those described in Example 1. It is understood from the above results that the developer supplying member of Example 2 possesses excellent so-called bias potential reduction, toner chargeability and durability.

EXAMPLE 3

A developer supplying member provided with a linear relief pattern was produced using the plasma CVD apparatus shown in FIG. 4. A straight-line relief pattern was used. First, a plasma polymerization reaction was conducted for approximately 60 min in substantially the same manner as described in Example 1, with the exception that the obtained fluorine-containing amorphous carbon film was 200 μm in thickness. Subsequently, the cylindrical substrate with the aforesaid film formed thereon was transported to an electron beam deposition apparatus (JEOL Ltd., model JEBE-4B No. 41006) via a gate valve, and scanned in the longitudinal direction with the electron beam focused at a depth of 100 μm. The cylindrical substrate was rotated 300 μm circumferentially after each scan. The reactor was maintained at a vacuum of $2.6 \times 10^{-5}$ torr at this time, and the electron beam exposure rate was 1 mC/cm². Next, the substrate was again transported through the gate valve to the plasma CVD apparatus used to form the fluorine-containing amorphous carbon film,. and in an operation identical to the previous film formation process, oxygen gas from the sixth tank 706 was introduced into the reactor 733 as an etching gas, 50-watt power with a frequency of 13.56 MHz was applied to the power application electrode 736 from the highfrequency power source 739, and the film was developed by plasma etching for approximately 10 min. When the surface of the obtained developer supplying member was measured for surface roughness using a surface roughness tester (Tokyo Seimitsu Co., Ltd., model 550A Saafukomu), the convex portions were found to have a film thickness of 100 μm, the line width of the concave portions was about 100 μm, and the line width of the convex portions was about 200 μm; the difference in thickness between the concave and convex portions was about 18 μm.

When the characteristics of the obtained developer supplying member were evaluated in the same manner as described in Example 1, virtually identical results were obtained. It is understood from these results that the developer supplying member of the present example possesses excellent so-called bias potential reduction, toner chargeability and durability.

Further, because a solid image density of 1.1 to 1.4 was obtained throughout the aforesaid tests, the developer supplying member provided with a linear relief pattern is understood to have superior developer transportability.

EXAMPLE 4

A developer supplying member provided with a linear relief pattern was produced using the plasma CVD apparatus shown in FIG. 4. A spiral-shaped relief pattern was used. First, a plasma polymerization reaction was conducted for approximately 2 hrs in substantially the same manner as described in Example 2, with the exception that the obtained fluorine-containing amorphous carbon film was approximately 1 mm in thickness. Subsequently, the cylindrical substrate with the aforesaid film formed thereon was transported to an electron beam deposition apparatus (JEOL Ltd., model JEBE-4B No. 41006) via a gate valve, and rotated as it was scanned in the longitudinal direction so as to scan a distance of 500 μm with each rotation of the substrate with the electron beam focused at a depth of 200 μm, thereby forming a latent image. The reactor was maintained at a vacuum of $2.6 \times 10^{-5}$ torr at this time, and the electron beam exposure rate was 1 mC/cm². Next, the substrate was again transported through the gate valve to the plasma CVD apparatus used to form the fluorine-containing amorphous carbon film as shown in FIG. 7, and in an operation identical to the previous film formation process, oxygen gas from the sixth tank 706 was introduced into the reactor 733 as an etching gas, 200-watt power with a frequency of 13.56 MHz was applied to the power application electrode 736 from the high-frequency power source 739, and the film was developed by plasma etching for approximately 20 min. When the surface of the obtained developer supplying member was measured for surface roughness using a surface roughness tester (Tokyo Seimitsu Co., Ltd., model 550A Saafukomu), the line width of the concave portions was about 200 μm, and the line width of the convex portions was about 300 μm; the difference in thickness between the concave and convex portions was about 100 μm.

When the characteristics of the obtained developer supplying member were evaluated in the same manner as described in Example 3, some reduction in chargeability to 14 μC/g was noted in monocomponent developing device tests, although other results were virtually identical with those obtained in Example 3. It is understood from these results that the developer supplying member of Example 4 possesses excellent so-called bias potential reduction, toner chargeability, durability and developer transportability.

EXAMPLE 5

A developer supplying member provided with a punctate surface relief pattern was prepared using the plasma CVD apparatus shown in FIG. 7. A circular relief pattern was used.

A fluorine-containing amorphous carbon film was produced in the same manner as described in Example 3. However, in Example 5, during electron beam scanning the scan was stopped each 300 μm in the longitudinal direction whereupon the film was exposed to an electron beam.

When the surface of the obtained developer supplying member was measured in the same manner as described in Example 3, results were identical; the convex portions were found to have a film thickness of 100 μm, the maximum diameter of the concave portions was about 100 μm, and the difference in film thickness between the concave and convex portions was about 18 μm.

When the characteristics of the obtained developer supplying member were evaluated in the same manner as described in Example 1, the results were virtually identical with those obtained for Example 1. It is understood from these results that the developer supplying member of Example 5 possesses excellent bias potential reduction, toner chargeability and durability.

Further, because a solid image density of 1.1 to 1.4 was obtained throughout the aforesaid tests, the developer supplying member provided with a punctate relief pattern is understood to have superior developer transportability.

EXAMPLE 6

A developer supplying member provided with a punctate surface relief pattern was prepared using the plasma CVD apparatus shown in FIG. 7. A circular relief pattern was used.

First, a fluorine-containing amorphous carbon film was prepared in substantially the same manner as described in Example 2, with the exception that plasma polymerization was performed for about 2 hus and the thickness of the obtained film was approximately 1 mm.

Next, the fourth regulator valve 710 is opened to introduce carbon tetrafluoride gas from the fourth tank 704 into the fourth flow controller 716. The dials on the flow oontrollers were adjusted to supply the carbon tetrafluoride gas as a flow rate of 30 scom to the reactor 733 through the main pipe 732. Following stabilization of the gas flow, the internal pressure of the reactor 733 was adjusted to 1.0 torr by the pressure control valve 745. The substrate 752 was maintained at a temperature of 130° C. With the gas flow rate and the pressure in stabilized state, 150-watt power witha frequency of 13.56 MHz was applied to the power application electrode 736 from the high-frequency power source 739 pre-connected thereto by the selecting switch 744 to conduct plasma polymerization for approximately 10 min so as to effect a negative-to-positive reversal. After completion of the film formation, the power supply was discontinued, the regulator valves were closed, and the reactor was thoroughly exhausted.

Next, a punctate surface relief pattern comprising circular patterns was formed on the convex portion by the same method as was used to form the linear surface relief pattern in Example 4. A point of departure with Example 4, however, was that the substrate rotation in the circumferential direction was stopped every 500 μm as the substrate was scanned, then at each stop position the substrate was exposed to the electron beam.

When the surface of the obtained developer supplying member wwas measured, the film thickness on the convex portion was about 500 μm, the maximum diameter of the concave portion was about 200 μm, and the difference in film thickness between the concave and convex portions was about 100 μm.

When the characteristics of the obtained developer supplying member were evaluated in the same manner as described in Example 3, some charging reduction was observed at 14 μC/g in the monocomponent developing device test, although other results were virtually identical with those obtained in Example 3. It is understood from the above results that the developer supplying member of Example 6 possesses excellent bias potential reduction, toner charging, durability and developer transportability.

EXAMPLE 7

A developer supplying member shown in FIG. 1 was prepared using the plasma CVD apparatus shown in FIG. 7.

The plasma CVD apparatus shown in FIG. 7 was used. First the interior of the reactor 733 was evacuated to a high vacuum of approximately $10^{-6}$ torr, and the seventh regulator valve 725 was thereafter opened and 1H,1H,5H-octafluoropentyl methacrylate $CH_2=C(CH_3)COOCH_2(CF_2)_4H$ gas from the first container 719 heated to a temperature of 75° C. by first the heater 722 was introduced into the seventh flow controller 728. The dial on the flow controllers was adjusted to supply the 1H,1H,5H-octafluoropentyl methacrylate $CH_2=C(CH_3)COOCH_2(CF_2)_4H$ gas at a flow rate 16.8 sccm to the reactor 733 through the main pipe 732. Following stabilization of each gas flow, the internal pressure of the reactor 733 was adjusted to 0.25 torr by the pressure control valve 745. On the other hand, the substrate 752 was used, said substrate being a cylindrical aluminum substrate measuring 22 mm in diameter and 330 mm in length. The substrate 752 was preheated to a temperature of 160° C. prior to the introduction of the gas. With the gas flow rate and the pressure in stabilized states, 105-watt power with a frequency of 50 kHz was applied to the power application electrode 736 from the low-frequency power source 741 pre-connected thereto by the selecting switch 744 to conduct plasma polymerization for approximately 30 min, forming a plasma-polymerized film 100 μm in thickness on the substrate 752. After completion of the film formation, the power supply was discontinued, the regulator valves were closed, and the reactor 733 was thoroughly exhausted.

Figure 8:
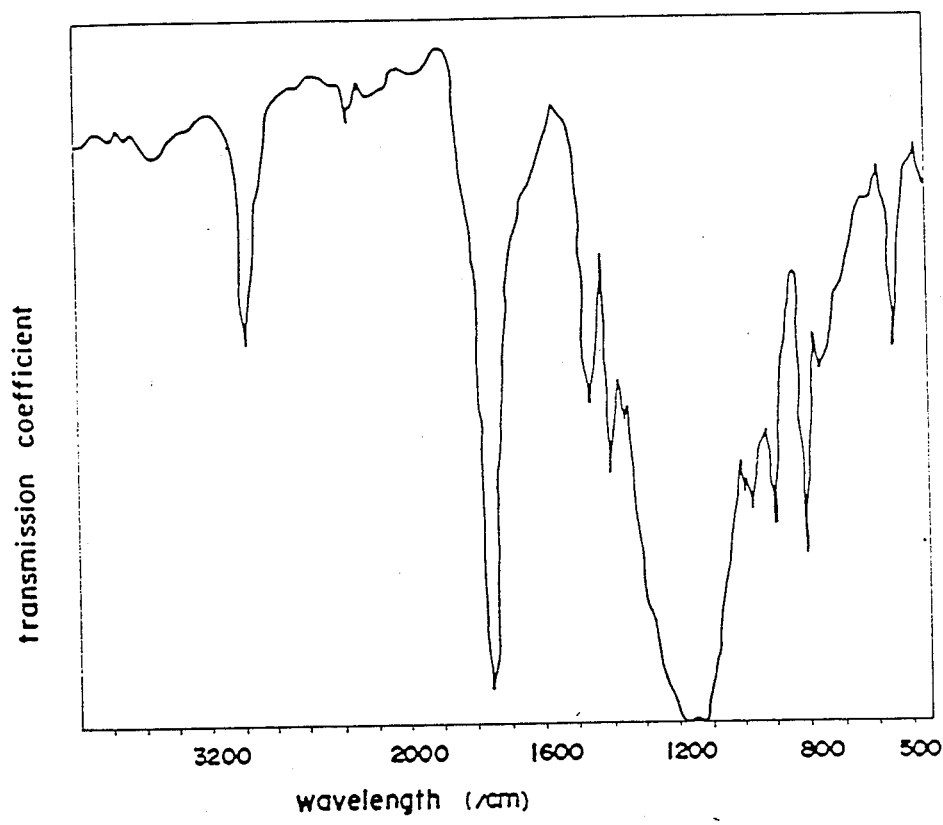
FIG. 8 shows the infrared absorption spectrum of the organic polymer layer invention.

When the thus obtained plasma-polymerized film was subjected to elementary analysis, the quantity of hydrogen atoms found therein was 31 atomic %, the quantity of fluorine atoms totalled 24 atomic % and the quantity of oxygen atoms was 5 atomic % based on the total constituent atoms of the structure. The infrared absorption spectrum of the plasma-polymerized film shown in FIG. 8 confirms the presence of the 1H,1H,5H-octafluoropentyl methacrylate $CH_2=C(CH_3)COOCH_2(CF_2)_4H$ structure.

Further, the film possessed a hardness greater than 7H based on measurements for pencil lead hardness as provided in Japanese Industrial Standards JIS-K-5400, said hardness rating being vastly superior to that of polymer films obtained from conventional organic compound reactions.

When the characteristics of the obtained developer supplying member were evaluated in the same manner as described in Example 1, results of charging tests in monocomponent developing devices were 17 $\mu C/g$. Other findings were virtually identical with those described in Example 1. It is understood from the above results that the developer supplying member of Example 7 possesses excellent bias potential reduction, toner chargeability and durability.

EXAMPLE 8

The developer supplying member shown in FIG. 1 was produced using the plasma CVD apparatus shown in FIG. 7.

The plasma CVD apparatus shown in FIG. 7 was used. First the interior of the reactor 733 was evacuated to a high vacuum of approximately $10^{-6}$ torr, and the seventh regulator valve 725 was thereafter opened to introduce 1H,1H,2H,2H-heptadecafluorodecyl methacrylate $CH_2=C(CH_3)COO(CH_2)_2(CF_2)_8F$ gas from the first container 719 and heated to a temperature of 85° C. by first the heater 722 into the seventh flow controller 28. At the same time, the first regulator valve 707 was opened to introduced hydrogen gas from the first tank 701 into the first flow controller 713. The dials on the flow controllers were adjusted to supply the 1H,1H,2H,2H-heptadecafluorodecyl methacrylate $CH_2=C(CH_3)COO(CH_2)_2(CF_2)_8F$ gas at a flow rate of 12.3 sccm and the hydrogen gas at 30 sccm to the reactor 733 through the main pipe 732. Following stabilization of each gas flow, the internal pressure of the reactor 733 was adjusted to 0.20 torr by the pressure control valve 745. On the other hand, the substrate 752 was used, said substrate being an aluminum cylindrical substrate measuring 22 mm in diameter and 330 mm in length. The substrate 752 was preheated to a temperature of 130° C. prior to the introduction of the gases. With the gas flow rates and the pressure in stabilized states, 215-watt power with a frequency of 200 kHz was applied to the power application electrode 736 from the low-frequency power source 741 pre-connected thereto by the selecting switch 744 to conduct plasma polymerization for approximately 1 hr, forming a plasma-polymerized film 500 $\mu m$ in thickness on the substrate 752. After completion of the film formation, the power supply was discontinued, the regulator valves were closed, and the reactor 733 was thoroughly exhausted.

When the thus obtained plasma-polymerized film was subjected to elementary analysis, the quantity of hydrogen atoms found therein was 28 atomic %, the quantity of fluorine atoms totalled 28 atomic %, and the quantity of oxygen atoms was 4 atomic % based on the total constituent atoms of the structure. Further, the film possessed a hardness greater than 7H based on measurements for pencil lead hardness as provided in Japanese Industrial Standards JIS-K-5400, said hardness rating being vastly superior to that of polymer films obtained from conventional organic compound reactions.

When the characteristics of the obtained developer supplying member were evaluated in the same manner as described in Example 1, some reduction in chargeability to 14 $\mu C/g$ was noted monocomponent developing device tests, although other results were virtually identical with those obtained in Example 1. It is understood from these results that the developer supplying member of Example 8 possesses excellent bias potential reduction, toner chargeability and durability.

EXAMPLE 9

The developer supplying member shown in FIG. 1 was produced using the plasma CVD apparatus shown in FIG. 7.

The plasma CVD apparatus shown in FIG. 7 was used. First the interior of the reactor 733 was evacuated to a high vacuum of approximately $10^{-6}$ torr, and the seventh regulator valve 725 was thereafter opened to introduce 2,2,2-trifluoroethylacrylate $CH_2=CHCOOCH_2CF_3$ gas from the first container 719 and heated to a temperature of 75° C. by first the heater 722 into the seventh flow controller 728. The dials on the flow controllers were adjusted to supply the 2,2,2-trifluoroethylacrylate $CH_2=CHCOOCH_2CF_3$ gas at a flow rate of 46.3 sccm to the reactor 733 through the main pipe 732. Following stabilization of the gas flow, the internal pressure of the reactor 733 was adjusted to 0.2 torr by the pressure control valve 745. On the other hand, the substrate 752 was used, said substrate being an aluminum cylindrical substrate measuring 22 mm in diameter and 330 mm in length. The substrate 752 was preheated to a temperature of 100° C. prior to the introduction of the gas. With the gas flow rate and the pressure in stabilized states, 130-watt power with a frequency of 100 kHz was applied to the power application electrode 736 from low-frequency power source 741 pre-connected thereto by the selecting switch 744 to conduct plasma polymerization for approximately 40 min, forming a plasma-polymerized film 300 $\mu m$ in thickness on the substrate 752. After completion of the film formation, the power supply was discontinued, the regulator valves were closed, and the reactor 733 was thoroughly exhausted.

When the thus obtained plasma-polymerized film was subjected to elementary analysis, the quantity of hydrogen atoms found therein was 31 atomic %, the quantity of fluorine atoms totalled 24 atomic %, and the quantity of oxygen atoms was 5 atomic % based on the total constituent atoms of the structure. Further, the film possessed a hardness greater than 7H based on measurements for pencil lead hardness as provided in Japanese Industrial Standards JIS-K-5400, said hardness rating being vastly superior to that of polymer films obtained from conventional organic compound reactions.

When the characteristics of the obtained developer supplying member were evaluated in the same manner as described in Example 1, the results were virtually identical. It is understood from these results that the developer supplying member of Example 9 possesses excellent bias potential reduction, toner chargeability and durability.

EXAMPLE 10

A developer supplying member provided with a linear relief surface pattern was produced using the plasma CVD apparatus shown in FIG. 7. A straight-line linear relief pattern was used.

First, a plasma-polymerized organic film was manufactured in substantially the same manner as described in Example 7, with the exception that the plasma polymerization reaction was conducted for approximately 60 min and the obtained film had a thickness of about 200 μm.

Next, a liner relief pattern was formed on the aforesaid film using the same method as described in Example 3. When the surface of the obtained developer supplying member was measured, the results were identical to those obtained in Example 3.

When the characteristics of the obtained developer supplying member were evaluated in the same manner as described in Example 1, a chargeability of 17 μC/g was noted in monocomponent developing device tests, whereas other results were virtually identical with those obtained in Example 1. It is understood from these results that the developer supplying member of Example 10 possesses excellent bias potential reduction, toner chargeability and durability.

Further, because a solid image density of 1.1 to 1.4 was obtained throughout the aforesaid tests, the developer supplying member provided with a linear relief pattern is understood to have superior developer transportability.

EXMAPLE 11

A developer supplying member provided with a linear relief surface pattern was produced using the plasma CVD apparatus shown in FIG. 7. A spiral linear relief pattern was used.

First, a plasma-polymerized organic film was manufactured in substantially the same manner as described in Example 2, with the exception that the plasma polymerization reaction was conducted for approximately 2 hrs and the obtained film had a thickness of about 1 mm. The linear relief pattern was formed on the plasmapolymerized organic film in the same manner as described in Example 2.

Next, the linear relief pattern was formed on the aforesaid film by substantially the same method described in Example 4, with the exception that the electron beam exposure rate was 2 mC/g and the plasma etching time was 200 min. When the surface of the obtained developer supplying member was measured for surface roughness using a surface roughness tester (Tokyo Seimitsu Co., Ltd., model 550A Saafukomu), film thickness of the convex portion was about 500 μm, the line width of the concave portion was about 200 μm, and the line width of the convex portions was about 300 μm; the difference in thickness between the concave and convex portions was about 100 μm.

When the characteristics of the obtained developer supplying member were evaluated in the same mannef as described in Example 3, some reduction in chargeability to 14 μC/g was noted in monocomponent developing device tests, although other results were virtually identical with those obtained in Example 3. It is understood from these results that the developer supplying member of Example 11 possesses excellent bias potential reduction, toner chargeability, durability and developer transportability.

EXAMPLE 12

A developer supplying member provided with a linear relief pattern was prepared using the plasma CVD apparatus shown in FIG. 7. A spiral linear relief pattern was used.

First, a plasma-polymerized organic film was prepared in substantially the same manner as described in Example 9, with the exception that the plasma polymerization time was about 80 min and the film thickness was 600 μm.

Subsequently, the cylindrical substrate with the aforesaid film formed thereon was transported to an electron beam deposition apparatus (JEOL Ltd., model JEBE-4B No. 41006) via a gate valve, and rotated as it was scanned in the longitudinal direction so as to scan a distance of 2 mm with each rotation of the substrate with the electron beam focused at a depth of 1 mm thereby forming a latent image. The reactor was maintained at a vacuum of $2.6 \times 10^{-5}$ torr at this time, and the electron beam exposure rate was 2 mC/cm$^2$. Next, the substrate was again transported through the gate valve to the plasma CVD apparatus used to form the plasma-polymerized organic film as shown in FIG. 7, and in an operation identical to the previous film formation process, oxygen gas from the sixth tank 706 was introduced into the reactor 733 as an etching gas, 250-watt power with a frequency of 13.56 MHz was applied to the power application electrode 736 from the high-frequency power source 739, and the film was developed by plasma etching for approximately 60 min. When the surface of the obtained developer supplying member was measured for surface roughness using a surface roughness tester (Tokyo Seimitsu Co., Ltd., model 550A Saafukomu), the film thickness of the convex portion was about 300 μm, the line width of the concave portions was about 1 mm, and the line width of the convex portions was about 1 mm; the difference in thickness between the concave and convex portions was about 200 μm.

When the characteristics of the obtained developer supplying member were evaluated in the same manner as described in Example 3, the results were virtually identical. It is understood from these results that the developer supplying member of Example 12 possesses excellent bias potential reduction, toner chargeability, durability and developer transportability.

EXAMPLE 13

A developer supplying member provided with a punctate surface relief pattern was prepared using the plasma CVD apparatus shown in FIG. 7. A circular punctate relief pattern was provided on the concave portions.

First, a plasma-polymerized organic film identical to that produced in Example 7 prepared in substantially the manner as described in Example 7, with the exception that plasma polymerization was conducted for about 60 min and the film thickness was about 200 μm.

Next, a punctate relief pattern was formed on the aforesaid film using substantially the same method as described in Example 3, with the points of departure being that the electron beam was focused so as to have a diameter of 100 μm, the cylindrical substrate was exposed to the spot-shaped electron beam every 200 μm in the longitudinal direction, and the substrate was rotated 200 μm in the circumferential direction at the completion of each scan, thereby forming a latent image pattern thereon.

When the surface of the obtained developer supplying member was measured, the film thickness on the convex portion was about 100 μm, the maximum diameter of the concave portion was about 100 μm, and the difference in film thickness between the concave and convex portions was about 18 μm.

When the characteristics of the obtained developer supplying member were evaluated in the same manner as described in Example 1, results virtually identical to those of Example 7 were obtained. It is understood from the above results that the developer supplying member of Example 13 possesses excellent bias potential reduction, toner charging and durability.

Further, because a solid image density of 1.1 to 1.4 was obtained throughout the aforesaid tests, the developer supplying member provided with a punctate relief pattern is understood to have superior developer transportability.

EXAMPLE 14

A developer supplying member provided with a punctate surface relief pattern was prepared using the plasma CVD apparatus shown in FIG. 7. A circular punctate relief pattern was provided on the convex portions First, a plasma-polymerized organic film identical to that produced in Example 8 was prepared in substantially the same manner as described in Example 7, with the exception that plasma polymerization was conducted for about 2 hrs and the film thickness was about 1 mm.

Then, the aforesaid film was exposed to carbon tetrafluoride plasma in the same manner as described in Example 6 to change the etching characteristics from negative to positive Next, a punctate relief pattern was formed on the aforesaid film using substantially the same method as described in Example 6, with the exception that the electron beam exposure rate was 2 mC/g.

When the surface of the obtained developer supplying member was measured, the film thickness on the convex portion was about 500 μm, the maximum diameter of the concave portion was about 200 μm, and the difference in film thickness between the concave and convex portions was about 100 μm.

When the characteristics of the obtained developer supplying member were evaluated in the same manner as described in Example 3, some reduction in chargeability to 14 μC/g was observed in monocomponent developing device tests, however other results were virtually identical to those of Example 3. It is understood from the above results that the developer supplying member of Example 14 possesses excellent bias potential reduction, toner charging, durability and developer transportability.

EXAMPLE 15

A developer supplying member provided with a punctate surface relief pattern was prepared using the plasma CVD apparatus shown in FIG. 7. A circular punctate relief pattern was provided on the concave portions.

First, a plasma-polymerized organic film identical to that produced in Example 9 was prepared in substantially the same manner, with the exception that plasma polymerization was conducted for about 80 min and the film thickness was about 600 μm.

Then, the aforesaid film was provided with a punctate surface relief pattern in the substantially the same manner as described in Example 12, with the points of departure being that during latent image formation the substrate was stopped every 1.5 mm as it rotated in the circumferential direction and said substrate was subjected to electron beam exposure while stopped at those points.

When the surface of the obtained developer supplying member was measured using a surface roughness tester (Tokyo Seimitsu, model 550A Saafukomu), the film thickness on the convex portion was abou 300 μm, the maximum diameter of the concave portion was about 1 mm, and the difference in film thickness between the concave and convex portions was about 200 μm.

When the characteristics of the obtained developer supplying member were evaluated in the same manner as described in Example 1, virtually identical results were obtained. It is understood from the above results that the developer supplying member of Example 15 possesses excellent bias potential reduction, toner charging and durability.

Further, because a solid image density of 1.1 to 1.4 was obtained throughout the aforesaid tests, the developer supplying member provided with a punctate relief pattern is understood to have superior developer transportability.

EXAMPLE 16

The developer supplying member shown in FIG. 1 was produced using the plasma CVD apparatus shown in FIG. 7.

The plasma CVD apparatus shown in FIG. 7 was used. First the interior of the reactor 733 was evacuated to a high vacuum of approximately $10^{-6}$ torr, and the seventh regulator valve 725 was thereafter opened to introduce $CF_3(CF_2)_5CH_2Si(OCH_3)_3$ gas from the first container 719 and heated to a temperature of 80° C. by first the heater 722 into the seventh flow controller 728. The dial on the flow controller was adjusted to supply the $CF_3(CF_2)_5CH_2Si(OCH_3)_3$ gas at a flow rate of 18 sccm to the reactor 733 through the main pipe 732. Following stabilization of the gas flow, the internal pressure of the reactor 733 was adjusted to 0.2 torr by the pressure control valve 745. On the other hand, the substrate 752 was used, said substrate being a cylindrical aluminum substrate measuring 22 mm in diameter and 330 mm in length. The substrate 752 was preheated to a temperature of 90° C. prior to the introduction of the gas. With the gas flow rate and the pressure in stabilized states, 105-watt power with a frequency of 30 kHz was applied to the power application elctrode 736 from the low-frequency pcwer source 741 pre-connected thereto by the selecting switch 744 to conduct plasma polymerization for apprcximately 30 min, fcrming a plasma-polymerized film 100 μm in thickness on the substrate 752. After completion of the film formation, the power supply was discontinued, the regulator valves were closed, and the reactor 733 was thoroughly exhausted.

When the thus obtained plasma-polymerized film was subjected to elementary analysis, the quantity of hydrogen atoms found therein was 27 atomic %, the quantity of fluorine atoms totalled 25 atomic %, the quantity of oxygen atoms was 2.5 atomic and the quantity of silicon atom was 2.4 atomic % based on the total constituent atoms of the strcture. Further, the film possessed a hardness greater than 7H based on measurements for pencil lead hardness as provided in Japanese Industrial Standards JIS-K-5400, said hardness rating being vastly superior to that of polymer films obtained from conventional organic compound reactions.

When the characteristics of the obtained developer supplying member were evaluated in the same manner as described in Example 1, virtually identical results were obtained. It is understood from the above results that the developer supplying member of Example 16 possesses excellent bias potential reduction, toner charging and durability.

EXAMPLE 17

The developer supplying member shown in FIG. 1 was produced using the plasma CVD apparatus shown in FIG. 7.

The apparatus shown in FIG. 7 for forming the cover layer of the developer supplying member was used. First the interior of the reactor 733 was evacuated to a high vacuum of approximately $10^{-6}$ torr, and the seventh regulator valve 725 was thereafter opened to introduce $CF_3(CF_2)_7CH_2CH_2Si(OCH_3)_3$ gas from the first container 719 and heated to a temperature of 105° C. by first the heater 722 into the seventh flow controller 728. At the same time, the first regulator valve 707 was opened to introduced hydrogen gas from the first tank 701 into the first flow controller 713. The dials on the flow controllers were adjusted 31 sccm and the hydrogen gas at 30 sccm to the reactor 733 through the main pipe 732. Following stabilization of each gas flow, the internal pressure of the reactor 733 was adjusted to 0.22 torr by the pressure control valve 745. On the other hand, the substrate 752 was used, said substrate being a cylindrical aluminum substrate measuring 22 mm in diameter and 330 mm in length. The substrate 752 was preheated to a temperature of 100° C. prior to the introduction of the gases. With the gas flow rates and the pressure in stabilized states, 215-watt power with a frequency of 200 kHz was applied to the power application electrode 736 from the low-frequency power source 741 preconnected thereto by the selecting switch 744 to conduct plasma polymerization for approximately 1 hr, forming a plasmapolymerized film 500 μm in thickness on the substrate 752. After completion of the film formation, the power supply was discontinued, the regulator valves were closed, and the reactor 733 was thoroughly exhausted.

When the thus obtained plasma-polymerized film was subjected to elementary analysis, the quantity of hydrogen atoms found therein was 22 atomic %, the quantity of fluorine atoms totalled 30 atomic %, the quantity of oxygen atoms was 1.9 atomic %, and the quantity of silicon atoms was 2 atomic % based on the total constituent atoms of the structure. Further, the film possessed a ardness greater than 7H based on measurements for pencil lead hardness as provided in Japanese Industrial Standards JIS-K-5400, said hardness rating being vastly superior to that of polymer films obtained from conventional organic compound reactions.

When the characteristics of the obtained developer supplying member were evaluated in the same manner as described in Example 1, some reduction in chargeability to 14 μC/g was noted in monocomponent developing device tests, although other results were virtually identical with those obtained in Example 1. It is understood from these results that the developer supplying member of Example 17 possesses excellent bias potential reduction, toner chargeability and durability.

EXAMPLE 18

The developer supplying member shown in FIG. 1 was produced using the plasma CVD apparatus shown in FIG. 7.

The apparatus shown in FIG. 7 was used. First the interior of the reactor 733 was evacuated to a high vacuum of approximately $10^{-6}$ torr, and the seventh regulator valve 725 was thereafter opened to introduce $CF_3(CF_2)_7CH_2CH_2SiCH_3Cl_2$ gas from the first container 719 and heated to a temperature of 100° C. by first the heater 722 into the seventh flow controller 728. The dial on the flow controller was adjusted to supply the $CF_3(CF_2)_7CH_2CH_2SiCH_3Cl_2$ gas at a flow rate of 38 sccm to the reactor 733 through the main pipe 732. Following stabilization of the gas flow, the internal pressure of the reactor 733 was adjusted to 0.2 torr by the pressure control valve 745. On the other hand, the substrate 752 was used,.said substrate being a cylindrical aluminum substrate measuring 22 mm in diameter and 330 mm in length. The substrate 752 was preheated to a temperature of 100° C. prior to the introduction of the gas. With the gas flow rate and the pressure in stabilized states, 110-watt power with a frequency of 70 kHz was applied to the power application electrode 736 from the low-frequency power source 741 pre-connected thereto by the selecting switch 744 to conduct plasma polymerization for approximately 40 min, forming a plasma-polymerized film 300 μm in thickness on the substrate 752. After completion of the film formation, the power supply was discontinued, the regulator valves were closed, and the reactor 733 was thoroughly exhausted.

When the thus obtained plasma-polymerized film was subjected to elementary analysis, the quantity of hydrogen atoms found therein was 28 atomic %, the quantity of fluorine atoms totalled 35 atomic %, and the quantity of oxygen atoms was 2.3 atomic %, the quantity of silicon atoms was 2.1 atomic %, and the quantity of chlorine atoms was 3.9 atomic % based on the total constituent atoms of the structure. Further, the film possessed a hardness greater than 7H based on measurements for pencil lead hardness as provided in Japanese Industrial Standards JIS-K-5400, said hardness rating being vastly superior to that of polymer films obtained from conventional organic compound reactions.

When the characteristics of the obtained developer supplying member were evaluated in the same manner as described in Example 1, a reduction in chargeability to 12 μC/g was observed in the monocomponent developing device tests, but this reduction was not a problem from a practical standpoint. Other results were virtually identical to those obtained in Example 1. It is understood from the above results that the developer supplying member of Example 18 possesses excellent bias potential reduction, toner charging and durability.

EXAMPLE 19

A developer supplying member provided with a linear relief surface pattern was produced using the plasma CVD apparatus shown in FIG. 7. A straight-line linear relief pattern was used.

First, a plasma-polymerized organic film was manufactured in the same manner as described in Example 16.

Next, a linear relief pattern was formed on the aforesaid film using substantially the same method as described in Example 3, except that the plasma etching time was about 60 min and the film thickness was 200 μm. When the surface of the obtained developer supplying member was measured, the results were identical to those obtained in Example 3.

When the characteristics of the obtained developer supplying member were evaluated in the same manner as described in Example 1, the results were virtually identical. It is understood from these results that the developer supplying member of Example 19 possesses excellent bias potential reduction, toner chargeability and durability.

Further, because a solid image density of 1.1 to 1.4 was obtained throughout the aforesaid tests, the developer supplying member provided with a linear relief pattern is understood to have superior developer transportability.

EXAMPLE 20

A developer supplying member provided with a linear surface relief pattern was prepared using the plasma CVD apparatus shown in FIG. 7. A spiral-shaped linear relief pattern was used.

First, a plasma-polymerized film was formed in substantially the same manner as described in Example 17, with the exception that plasma polymerization was conducted for about 2 hrs and the thickness of the obtained film was about 1 mm.

Next, the aforesaid film was provided with a linear relief pattern in substantially the same manner as described in Example 4, except that the electron beam exposure rate was 2 mC/g and the plasma etching time was 200 min.

When the surface of the obtained developer supplying member was measured using a surface roughness tester (Tokyo Seimitsu, model 550A Saafukomu), the film thickness on the convex portion was about 500 $\mu$m, the line width of the concave portion was about 200 $\mu$m, the line width of the convex portion was about 300 $\mu$m, and the difference in film thickness between the concave and convex portions was about 100 $\mu$m.

When the characteristics of the obtained developer supplying member were evaluated in the same manner as described in Example 3, some reduction in chargeability to 14 $\mu$C/g was observed in the monocomponent developing device tests, but this reduction was not a problem from a practical standpoint. Other results were virtually identical to those obtained in Example 3. It is understood from the above results that the developer supplying member of Example 20 possesses excellent bias potential reduction, toner charging, durability and developer transportability.

EXAMPLE 21

A developer supplying member provided with a linear surface relief pattern was prepared using the plasma CVD apparatus shown in FIG. 7. A spiral-shaped linear relief pattern was used.

First, a plasma-polymerized film was formed in substantially the same manner as described in Example 18, with the exception that plasma polymerization was conducted for about 80 min and the thickness of the obtained film was about 600 $\mu$m.

Next, the aforesaid film was provided with a linear relief pattern in the same manner as described in Example 12.

When the surface of the obtained developer supplying member was measured, the results were identical to those obtained in Example 12.

When the characteristics of the obtained developer supplying member were evaluated in the same manner as described in Example 3, a reduction in chargeability to 12 $\mu$C/g was observed in the monocomponent developing device tests, but this reduction was not a problem from a practical standpoint. Other results were virtually identical to those obtained in Example 3. It is understood from the above results that the developer supplying member of Example 21 possesses excellent bias potential reduction, toner charging, durability and developer transportability.

EXAMPLE 22

A developer supplying member provided with a punctate surface relief pattern was prepared using the plasma CVD apparatus shown in FIG. 7. A circular punctate relief pattern was provided on the concave portions.

First, a plasma-polymerized organic film identical to that produced in Example 16 was prepared in substantially the same manner, with the exception that plasma polymerization was conducted for about 60 min and the film thickness was about 200 $\mu$m.

Then, the aforesaid film was provided with a punctate surface relief pattern in the substantially the same manner as described latent image formation the substrate was stopped every 300 $\mu$m as it was scanned in the circumferential direction and said substrate was subjected to electron beam exposure while stopped at those points; plasma etching was conducted for 60 min.

When the surface of the obtained developer supplying member was measured, the results were identical with those obtained in Example 13.

When the characteristics of the ottained developer supplying member were evaluated in the same manner as described in Example 1, virtually identical results were obtained. It is understood from the above results that the developer supplying member of Example 22 possesses excellent bias potential reduction, toner charging and durability.

Further, because a solid image density of 1.1 to 1.4 was obtained throughout the aforesaid tests, the developer supplying member provided with a punctate relief pattern is understood to have superior developer transportability.

EXAMPLE 23

A developer supplying member provided with a punctate surface relief pattern was prepared using the plasma CVD apparatus shown in FIG. 7. A circular punctate relief pattern was provided on the convex portions.

First, a plasma-polymerized organic film was prepared in substantially the same manner as in Example 17, with the exception that plasma polymerization was conducted for about 2 hrs and the film thickness was about 1 mm.

Then, the aforesaid film was exposed to carbon tetrafluoride plasma in the same manner as described in Example 6 to change the etching characteristics from negative to positive.

Next, a punctate relief pattern was formed on the aforesaid film using substantially the same method as described in Example 4, with the points of departure being that during latent image formation the substrate was stopped every 500 $\mu$m as it was rotated in the circumferential direction and said substrate was subjected to electron beam exposure while stopped at those points; the electron beam exposure rate was 2 mC/g and plasma etching was conducted for 200 min.

When the surface of the obtained developer supplying member was measured using a surface roughness tester (Tokyo Seimitsu, model 550A Saafukomu), the film thickness on the concave portion was about 500 $\mu$m, the maximum diameter of the convex portion was about 200 $\mu$m, and the difference in film thickness between the concave and convex portions was about 100 μm.

When the characteristics of the obtained developer supplying member were evaluated in the same manner as described in Example 3, some reduction in chargeability to 14 μC/g was observed in the monocomponent developing device tests, but this reduction was not a problem from a practical standpoint. Other results were virtually identical to those obtained in Example 3. It is understood from the above results that the developer supplying member of Example 23 possesses excellent bias potential reduction, toner charging, durability and developer transportability.

EXAMPLE 24

A developer supplying member provided with a punctate surface relief pattern was prepared using the plasma CVD apparatus shown in FIG. 7. A circular punctate relief pattern was provided on the concave portions.

First, a plasma-polymerized organic film was prepared in substantially the same manner as in Example 18, with the exception that plasma polymerization was conducted for about 80 min and the film thickness was about 600 μm.

Next, a punctate relief pattern was formed on the aforesaid film using substantially the same method as described in Example 4, with the points of departure being that during latent image formation the substrate was stopped every 2 mm as it was rotated in the circumferential direction and said substrate was subjected to electron beam exposure while stopped at those points.

When the surface of the obtained developer supplying member was measured using a surface roughness tester (Tokyo Seimitsu, model 550A Saafukomu), the film thickness on the convex portion was about 300 μm, the maximum diameter of the concave portion was about 1 mm, and the difference in film thickness between the concave and convex portions was about 200 μm.

When the characteristics of the obtained developer supplying member were evaluated in the same manner as described in Example 3, a reduction in chargeability to 14 μC/g was observed in the monocomponent developing device tests, but this reduction was not a problem from a practical standpoint. Other results were virtually identical to those obtained in Example 3. It is understood from the above results that the developer supplying member of Example 20 possesses excellent bias potential reduction, toner charging, durability and developer transportability.

What is claimed is:

1. A developer supplying member which comprises a surface on which developer is transported, said surface being formed with an overcoat layer of an amorphous carbon film containing fluorine.

2. A developer supplying member as claimed in claim 1 wherein the amorphous carbon film is formed by plasma polymerization with a glow discharge method.

3. A developer supplying member as claimed in claim 1 wherein the amorphous carbon film contains fluorine in an amount of about 0.1 to about 35 atomic %.

4. A developer supplying member as claimed in claim 1 wherein the amorphous carbon film has a thickness of about 1 micron to 2 millimeters.

5. A developer supplying member as claimed in claim 1 wherein the surface is so formed with a plurality of concavities and convexities in a linear or dotted shape.

6. A developer supplying member as claimed in claim 5 wherein the thickness of each of the concavities is about 0 to about 95% of that of each of the convexities.

7. A developer supplying member as claimed in claim 5 wherein the maximum diameter of the concavities and convexities is about 5 micron to about 2 millimeters.

8. A developer supplying member as claimed in claim 1 is used as a developing sleeve in a developing device of a copying apparatus wherein the developer is magnetically attracted on its surface for transportation therealong.

9. A developer supplying member comprising a surface on which developer is transported, said surface being formed with an overcoat layer of an organic polymerized film formed by causing glow discharge using at least one compound selected from the group consisting of fluorine incorporating methacrylate, fluorine incorporating acrylate and fluoroalkylsilane.

10. A developer supplying member as claimed in claim 9 wherein the amorphous carbon film contains fluorine in an amount of about 0.1 to about 35 atomic %.

11. A developer supplying member as claimed in claim 9 wherein the amorphous carbon film has a thickness of about 1 micron to 2 millimeters.

12. A developer supplying member as claimed in claim 9 wherein the surface is so formed with a plurality of concavities and convexities in a linear or dotted shape.

13. A developer supplying member as claimed in claim 12 wherein the thickness of each of the concavities is about 0 to about 95% of that of each of the convexities.

14. A developer supplying member as claimed in claim 12 wherein the maximum diameter of the concavities and convexities is about 5 micron to about 2 millimeters.

15. A developer supplying member as claimed in claim 9 is used as a developing sleeve in a developing device of a copying apparatus wherein the developer is magnetically attracted for transportation therealong.

* * * * *

UNITED STATES PATENT AND TRADEMARK OFFICE
CERTIFICATE OF CORRECTION

PATENT NO. : 4,836,136

DATED : June 6, 1989

INVENTOR(S) : Toshiya NATSUHARA, et al.

It is certified that error appears in the above-identified patent and that said Letters Patent is hereby corrected as shown below:

Title page:

In Section [75] Inventor: Kindly add --Izumi OSAWA , Osaka, Japan--.

Signed and Sealed this

Twentieth Day of February, 1990

*Attest:*

JEFFREY M. SAMUELS

*Attesting Officer*      *Acting Commissioner of Patents and Trademarks*